(12) United States Patent  
Baek et al.

(10) Patent No.: US 8,785,992 B2
(45) Date of Patent: Jul. 22, 2014

(54) LIGHT-GUIDING STRUCTURE, IMAGE SENSOR INCLUDING THE LIGHT-GUIDING STRUCTURE, AND PROCESSOR-BASED SYSTEM INCLUDING THE IMAGE SENSOR

(75) Inventors: Kang-Hyun Baek, Hwaseong-si (KR); Sang-Il Jung, Dongdaemun-gu (KR); Jin-Ho Kim, Seocho-gu (KR); Jeong-Ho Lee, Gwanak-gu (KR); Jeong-Bin Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 335 days.

(21) Appl. No.: 13/186,667

(22) Filed: Jul. 20, 2011

(65) Prior Publication Data
US 2012/0018833 A1    Jan. 26, 2012

(30) Foreign Application Priority Data
Jul. 21, 2010   (KR) .......................... 10-2010-0070448

(51) Int. Cl.
  *H01L 31/062*   (2012.01)
  *H01L 31/113*   (2006.01)
  *H01L 27/146*   (2006.01)
(52) U.S. Cl.
  CPC ................................ H01L 27/14629 (2013.01)
  USPC .............................. 257/292; 257/432; 438/69
(58) Field of Classification Search
  None
  See application file for complete search history.

(56) References Cited

U.S. PATENT DOCUMENTS

| 5,844,290 | A * | 12/1998 | Furumiya ................ 257/432 |
| 7,135,725 | B2 * | 11/2006 | Kato ...................... 257/291 |
| 7,462,507 | B2 * | 12/2008 | Lee et al. .................. 438/59 |
| 7,524,690 | B2 * | 4/2009 | Ko et al. .................... 438/31 |
| 7,541,212 | B2 * | 6/2009 | Oh ............................ 438/48 |
| 2005/0285215 | A1 * | 12/2005 | Lee et al. ................. 257/432 |
| 2006/0151812 | A1 * | 7/2006 | Watanabe .................. 257/222 |
| 2007/0102736 | A1 * | 5/2007 | Chuang et al. ............ 257/290 |
| 2007/0262366 | A1 * | 11/2007 | Baek et al. ................ 257/292 |
| 2008/0283728 | A1 * | 11/2008 | Inoue ...................... 250/208.1 |
| 2009/0101949 | A1 * | 4/2009 | Back et al. ................ 257/292 |
| 2009/0130792 | A1 * | 5/2009 | Lee et al. ................... 438/70 |
| 2009/0189237 | A1 * | 7/2009 | Hirano ...................... 257/432 |

FOREIGN PATENT DOCUMENTS

| JP | 2007305690 A | 11/2007 |
| KR | 100579964 B1 | 5/2006 |
| KR | 20070035206 A | 3/2007 |

* cited by examiner

*Primary Examiner* — Andres Munoz
(74) *Attorney, Agent, or Firm* — Harness, Dickey & Pierce, P.L.C.

(57) ABSTRACT

An example embodiment relates to a light-guiding structure. The light-guiding structure may include a bottom surface and a sidewall defined by a first, a second, and a third insulating layer disposed on a semiconductor substrate. The bottom surface may be parallel to a main surface of the semiconductor substrate and may be disposed in the first insulating layer. The sidewall may penetrate the second and third insulating layers to extend to the first insulating layer, and the sidewall may be tapered with respect to the main surface of semiconductor substrate. The light-guiding structure may be included in a image sensor. The image sensor may be included in a processor-based system.

20 Claims, 6 Drawing Sheets

LIGHT-GUIDING STRUCTURE, IMAGE SENSOR INCLUDING THE LIGHT-GUIDING STRUCTURE, AND PROCESSOR-BASED SYSTEM INCLUDING THE IMAGE SENSOR

CROSS-REFERENCE TO RELATED APPLICATION

This application claims priority under 35 U.S.C. §119 to Korean Patent Application No. 10-2010-0070448, filed on Jul. 21, 2010, the disclosure of which is herein incorporated by reference in its entirety.

BACKGROUND

1. Field

Example embodiments relate to a light-guiding structure, an image sensor including the light-guiding structure, and/or a processor-based system including the image sensor.

2. Description of Related Art

Generally, a CMOS image sensor receives light and converts into an electronic signal to be delivered to a processor-based system. The processor-based system can form a digital image.

SUMMARY

Some example embodiments relate to a light-guiding structure, an image sensor including the light-guiding structure, and/or a processor-based system including the image sensor.

Some example embodiments relate to a light-guiding structure suitable for minimizing plasma damage to a semiconductor substrate.

Some example embodiments further relate to an image sensor including a light-guiding structure, which may improve electrical and optical properties through the light-guiding structure.

Some example embodiments further relate to a processor-based system including an image sensor including a light-guiding structure, which may improve a quality of a digital image formed by the image sensor.

In one example embodiment, the light-guiding structure may include a bottom surface and a sidewall defined by a first, a second, and a third insulating layers sequentially stacked on a semiconductor substrate. The bottom surface may be parallel to a main surface of the semiconductor substrate and may be disposed in the first insulating layer. The sidewall may penetrate the second and third insulating layers to extend to the first insulating layer, and the sidewall may be tapered. And the first insulating layer may expose a predetermined area of a lower surface of the second insulating layer at a side portion of the sidewall.

A thickness of the second insulating layer may be smaller than a thickness of each of the first and the third insulating layers. The second insulating layer may have a different etching rate than the first and third insulating layers. The second insulating layer may include a second material that is configured to form a second etch product, and the first insulating layer may include a first material that is configured to form a first etch product, where the second etch product may be distinguishable from the first etch product.

A length of the sidewall extending from the second insulating layer to the first insulating layer may be the same as the thickness of the second insulating layer.

A thickness of the first insulating layer under the bottom surface may be the same as the thickness of the second insulating layer.

An example embodiment relates to an image sensor including a conductive pattern disposed on a semiconductor substrate. First, second, and third insulating layers may be disposed sequentially on the semiconductor substrate and the conductive pattern. A light-guiding structure may be disposed adjacent to the conductive pattern and configured to vertically penetrate the second and third insulating layers to extend to the first insulating layer. The light-guiding structure may include a bottom surface parallel to a main surface of the semiconductor substrate and disposed in the first insulating layer and a sidewall disposed in the first, second, and third insulating layers and tapered with respect to the main surface of the semiconductor substrate. And the first insulating layer may be not formed between the conductive pattern and the second insulating layer.

The bottom surface of the light-guiding structure may be disposed between a lower surface and an upper surface of the conductive pattern.

The bottom surface of the light-guiding structure may be disposed between the conductive pattern and the second insulating layer.

The second insulating layer may have a different etching rate than the first and third insulating layers. The second insulating layer may include a second material that is configured to form a second etch product, and the first insulating layer may include a first material that is configured to form a first etch product, where the second etch product is distinguishable from the first etch product.

The image sensor may further include a photodiode disposed in the semiconductor substrate. An anti-reflective layer may be disposed between the semiconductor substrate and the first insulating layer, and may be configured to conformally cover the conductive pattern. At least one wire may be disposed in the third insulating layer.

An occupied area of the photodiode in the semiconductor substrate may be the same as an area of the bottom surface of the light-guiding structure.

The photodiode may face the bottom surface of the light-guiding structure across the anti-reflective layer and the first insulating layer, and the second insulating layer may be disposed between the conductive pattern and the at least one wire.

The first insulating layer may surround the conductive pattern and partially expose the anti-reflective layer on an upper portion of the conductive pattern, and the second insulating layer may be disposed on the anti-reflective layer and the first insulating layer to be in contact with the third insulating layer.

The first insulating layer may cover the anti-reflective layer, and the second insulating layer may be disposed on the first insulating layer to be in contact with the third insulating layer.

The image sensor may further include a fourth insulating layer disposed in the third insulating layer. The fourth insulating layer may have the same etching rate as the second insulating layer, and may be penetrated by the at least one wire.

An example embodiment relates to an image sensor including a conductive pattern disposed on a substrate, and an anti-reflective layer on the substrate and on the conductive pattern. A first insulating layer may be on the anti-reflective layer. A light-guiding structure may be included and configured to extend into, but not through, the first insulating layer.

A second insulating layer may be disposed on the conductive pattern, and at least one wire may be on the second insulating layer.

The image sensor may further include a third insulating layer disposed between the at least one wire and the second insulating layer. The anti-reflective layer may be disposed between the conductive pattern and the second insulating layer.

The light-guiding structure may have a tapered sidewall. And the tapered sidewall may be defined by the first insulating layer and the second insulating layer.

The anti-reflective layer is in contact with the second insulating layer through the first insulating layer above an upper surface of the conductive pattern.

BRIEF DESCRIPTION OF THE DRAWINGS

The foregoing and other features and advantages of the inventive concepts will be apparent from the more particular description of non-limiting embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Various example embodiments will now be described in further detail hereinafter with reference to the accompanying drawings in which some embodiments are shown. Example embodiments of inventive concepts may be embodied in different forms and should not be construed as limited to the example embodiments set forth herein. Rather, these example embodiments are provided merely so that this disclosure will be more thorough and complete and will better convey the scope of the inventive concepts to those skilled in the art. In the drawings, the sizes and the relative sizes of layers and regions may have been exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms "first," "second," may be used herein to describe various elements, components, regions, layers and/or sections, these elements, components, regions, layers and/or sections should not be limited by these terms. These terms are only used to distinguish one element, component, region, layer or section from another region, layer or section. As used herein, the term "at least one" includes any and all combinations of one or more of the associated listed items. Meanwhile, spatially relative terms, such as "upper portion," "side portion," "under," and "on" and the like, which are used herein for ease of description to describe one element or feature's relationship to another element(s) or feature(s) as illustrated in the figures, should be interpreted similarly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments relate to a light-guiding structure, an image sensor including the light-guiding structure, and a processor-based system including the image sensor.

An image sensor according to an example embodiment will be described in further detail with reference to FIG. 1.

Figure 1:
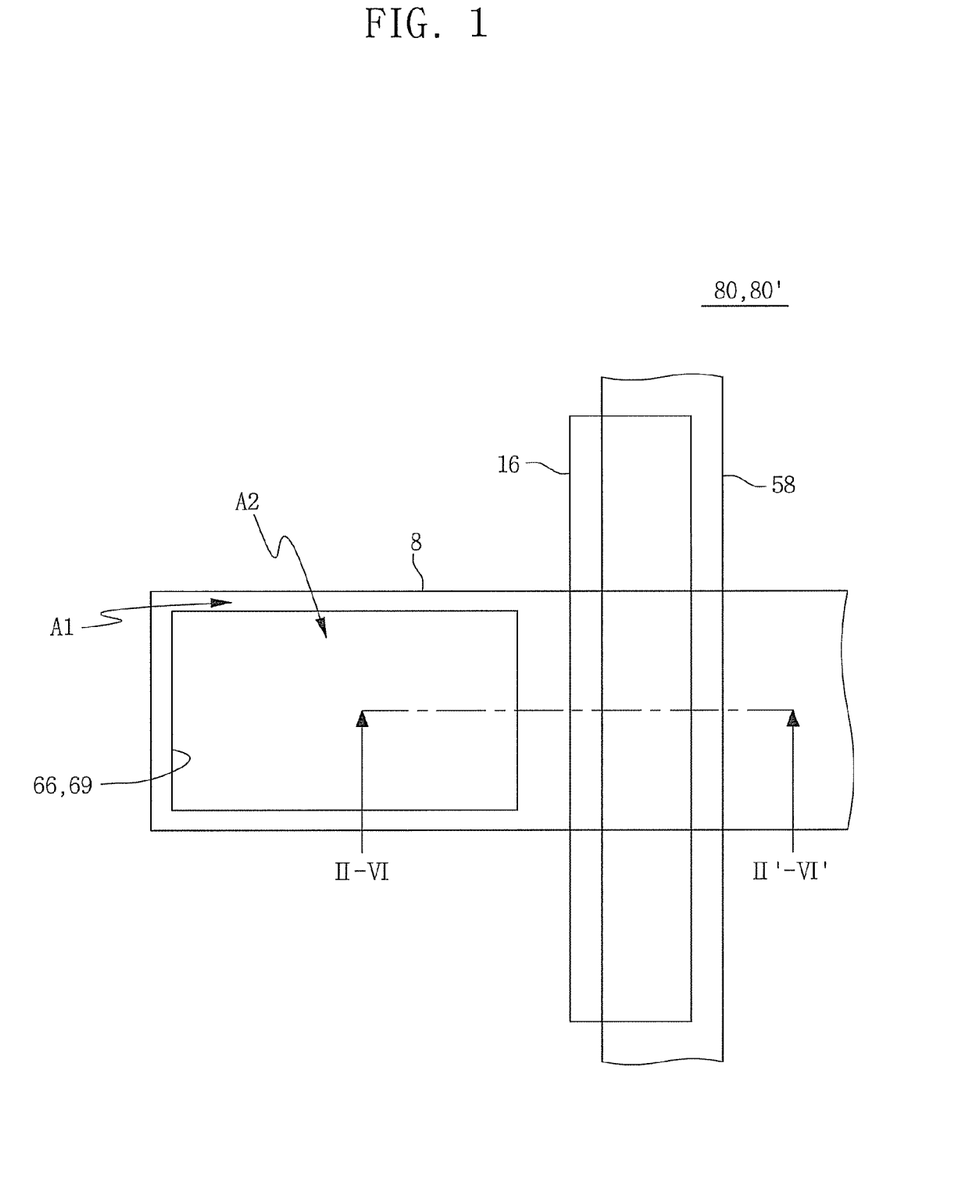
FIG. 1 is a plan view showing an image sensor according to an example embodiment.

FIG. 1 is a plan view showing an image sensor according to an example embodiment.

Referring to FIG. 1, an image sensor 80 or 80' may include an active region 8 and a conductive pattern 16. The active region 8 may partially overlap the conductive pattern 16. The conductive pattern 16 may traverse the active region 8 and protrude from the active region 8. The image sensor 80 or 80' may include at least one wire 58 and a light-guiding structure 66 or 69. The light-guiding structure 66 or 69 may be disposed adjacent to a side portion of the conductive pattern 16.

The light-guiding structure 66 or 69 may overlap the active region 8. An area A2 of the light-guiding structure 66 or 69 may be the same size as, or a different size, than an area A1 of the active region 8 adjacent to the side portion of the conductive pattern 16. The area A1 of the active region 8, adjacent to the side portion of the conductive pattern 16, may correspond to an occupied area of a photodiode PD created at least partially by a first impurity diffused region 24 in a main surface S of a semiconductor substrate 4 of FIG. 2.

Figure 4:
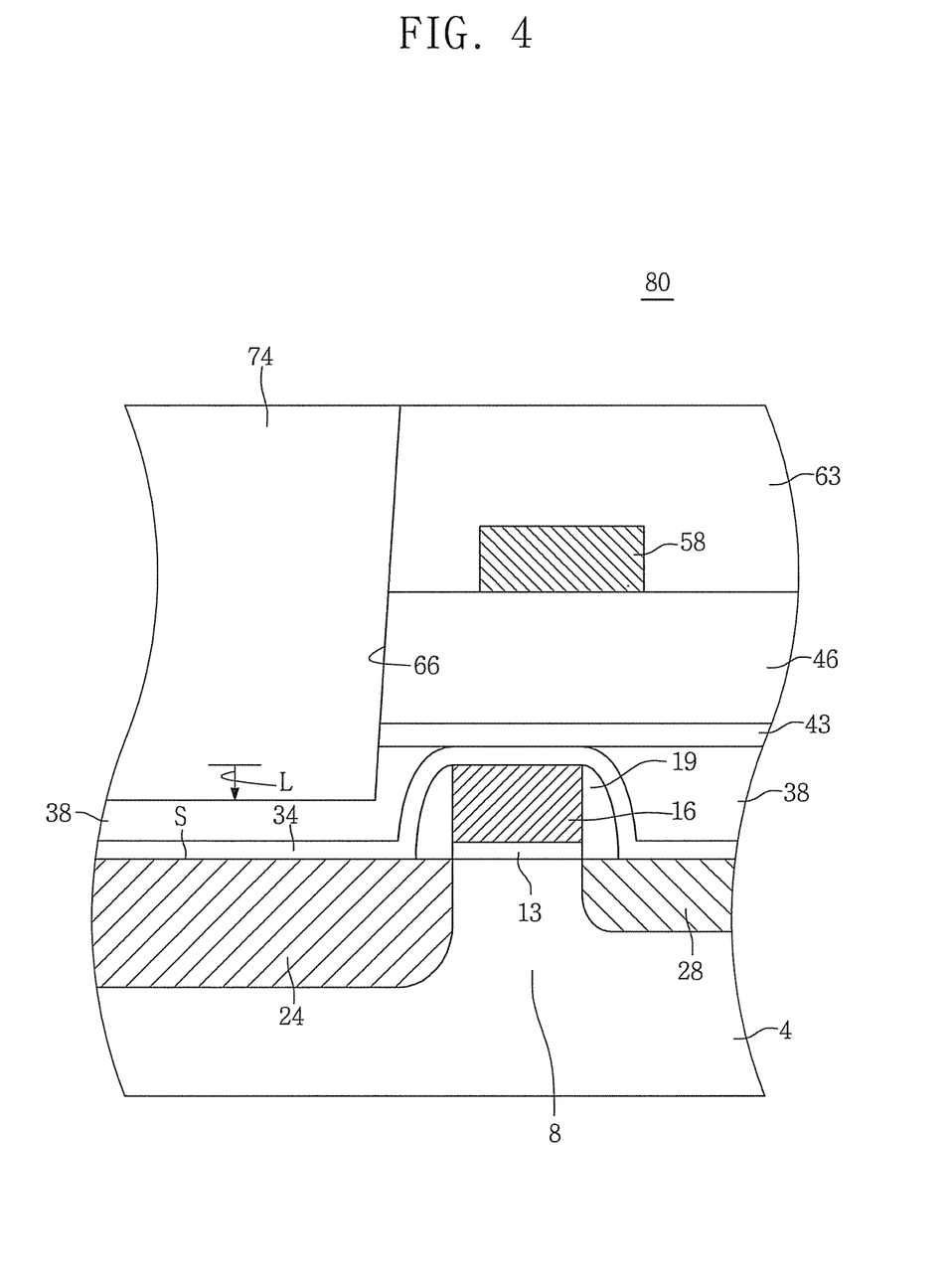
Figure 6:
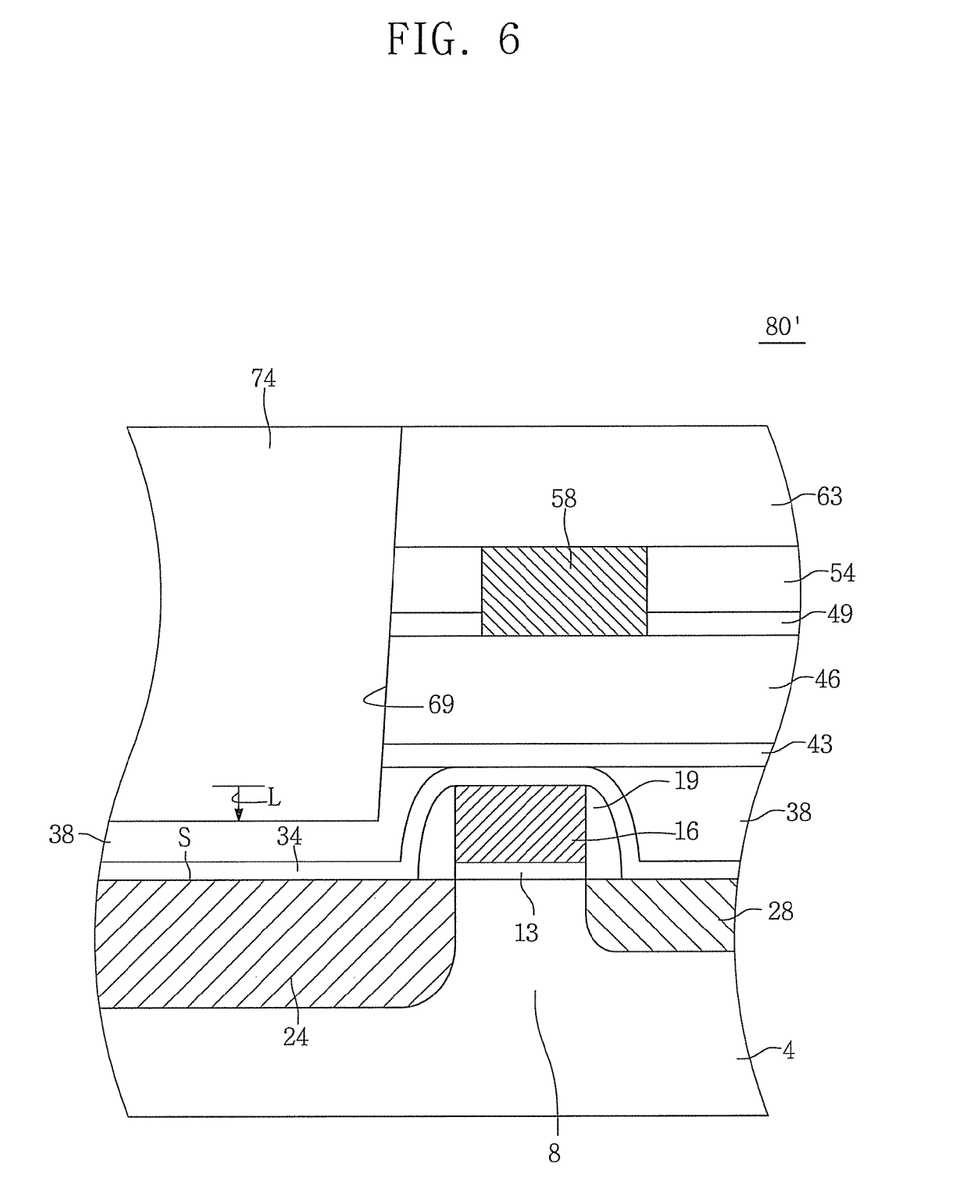

The area A2 of the light-guiding structure 66 or 69 may correspond to an area of a bottom surface of the light-guiding structure 66 or 69 of FIG. 4 or FIG. 6. The at least one wire 58 may be disposed along the conductive pattern 16 and may overlap the conductive pattern 16.

Next, a method of forming an image sensor 80 may be described in further detail with reference to FIGS. 2 to 6
Example Embodiment 1

Figure 2:
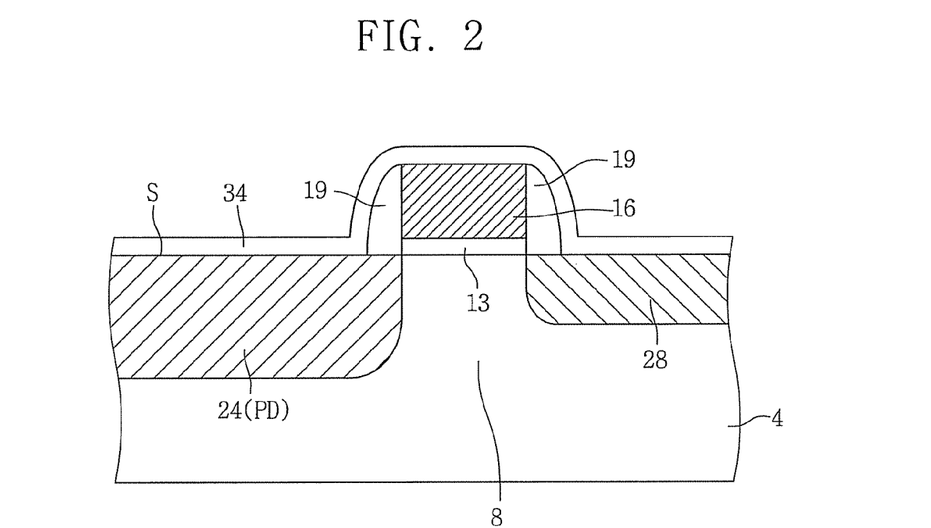
FIGS. 2 through 4, are cross-sectional views taken along line II-II', III-III', and IV-IV' of FIG. 1, illustrating a method of forming an image sensor.
Figure 3:
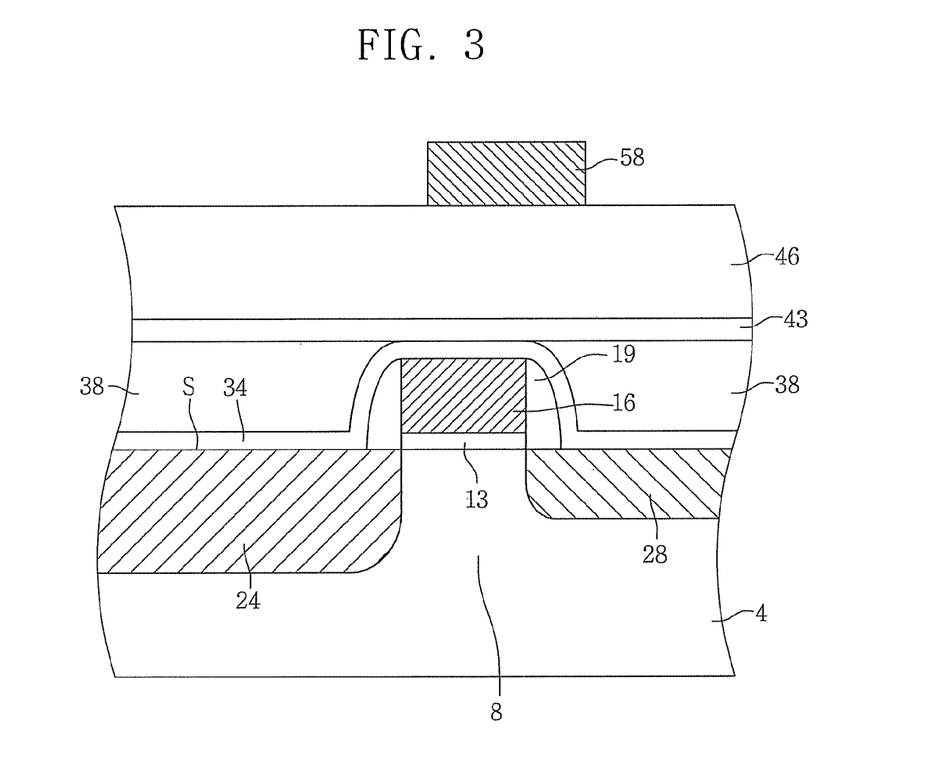

FIGS. 2 to 4 are cross-sectional views taken along line II-II', III-III', and IV-IV' of FIG. 1, illustrating a method of forming an image sensor 80.

Referring to FIG. 2, an active region 8 may be provided in a semiconductor substrate 4. A top surface of the active region 8 may be the same level as, or a different level, from a main surface of the semiconductor surface 4. An insulating pattern 13 and a conductive pattern 16 may be sequentially formed on the active region 8. The insulating pattern 13 may include a material having a different etching rate from the semiconductor substrate 4. The conductive pattern 16 may include a material having a different etching rate from the insulating pattern 13.

Spacers 19 may be formed on side portions of the insulating pattern 13 and the conductive pattern 16. The spacers 19 may include the same insulating material as the insulating layer 13. First and second impurity diffused regions 24 and 28 may be formed in the active region 8 using the conductive pattern 16 and the spacers 19 as a mask. The first and second impurity diffused regions 24 and 28 may be formed in different steps.

The first impurity diffused region 24 may be formed in (or on) a side portion of the conductive pattern 16. The first impurity diffused region 24 may include or serve as at least part of the photodiode PD. The second impurity diffused region 28 may be formed opposite to the side portion of the conductive pattern 16. The first impurity diffused region 24 may have a different volume than the second impurity diffused region 28 in the active region 8.

The first and second impurity diffused regions 24 and 28 may be formed in different steps from each other prior to the formation of the spacers 19.

An anti-reflective layer 34 may be formed on the main surface S of the semiconductor substrate 4 to conformally cover the conductive pattern 16 and the spacers 19. The anti-reflective layer 34 may be formed of the same insulating material as, or a different insulating material than the spacers 19.

Referring to FIG. 3, a first insulating layer 38 may be formed on the anti-reflective layer 34. The first insulating layer 38 may surround the conductive pattern 16 to expose the anti-reflective layer 34 formed on an upper portion of the conductive pattern 16. In this case, a second insulating layer 43 and a third insulating layer 46 may be sequentially formed on the anti-reflective layer 34 and the first insulating layer 38. The second insulating layer 43 may be in contact with the anti-reflective layer 34 and the first insulating layer 38.

Also, the third insulating layer 46 and the second insulating layer 43 may be sequentially formed on the anti-reflective layer 34 and the first insulating layer 38. A thickness of the second insulating layer 43 may be smaller than that of the first and third insulating layers 38 and 46. On the other hand, the first insulating layer 38 may cover the anti-reflective layer 34. In this case, the second and third insulating layers 43 and 46 may be sequentially formed on the first insulating layer 38. Also, the third insulating layer 46 and the second insulating layer 43 may be sequentially formed on the first insulating layer 38.

The first insulating layer 38 may include a material having a different etching rate than the anti-reflective layer 34. The first insulating layer 38 may include a material having the same etching rate as, or a different etching rate than, the third insulating layer 46. The second insulating layer 43 may include a material having the same etching rate as the anti-reflective layer 34. The second insulating layer 43 may include a material having a different etching rate than the first and third insulating layers 38 and 46.

Subsequently, when the first insulating layer 38 exposes the anti-reflective layer 34, at least one wire 58 may be formed on the second insulating layer 43 or the third insulating layer 46. On the other hand, when the first insulating layer 38 covers the anti-reflective layer 34, the at least one wire 58 may be formed on the second insulating layer 43 or the third insulating layer 46. The at least one wire 58 may include a conductive material.

Referring to FIG. 4, when the first insulating layer 38 exposes the anti-reflective layer 34 as shown in FIG. 3, a sixth insulating layer 63 may be formed on the third insulating layer 46 to cover the at least one wire 58. The sixth insulating layer 63 may include the same material as, or a different material than, the third insulating layer 46. The at least one wire 58 and the sixth insulating layer 63 may be repeatedly formed on the third insulating layer 46.

A first photo process may be applied on the sixth insulating layer 63. The first photo process may be performed using semiconductor photo equipment to form a photoresist layer (not shown) on the sixth insulating layer 63. The semiconductor photo equipment may form an opening in the photoresist layer. The opening of the photoresist layer may be aligned with the first impurity diffused region 24 of the active region 8 as shown in FIG. 2. The photoresist layer may expose the sixth insulating layer 63 through the opening.

A first plasma etching process may be applied on the first, second, third and sixth insulating layers 38, 43, 46 and 63 through the opening of the photoresist layer. In this case, the first plasma etching process may be performed using first semiconductor plasma etching equipment. The first semiconductor plasma etching equipment may maintain a first process environment in a chamber thereof to etch the third and sixth insulating layers 46 and 63.

The first process environment may include an input amount of an etching gas in the chamber and sizes of powers for maintaining plasma of the etching gas in the chamber. The first semiconductor plasma etching equipment may use the photoresist layer and the second insulating layer 43 as an etch mask and an etch stopping layer to etch the third and sixth insulating layers 46 and 63.

After the etching of the third and sixth insulating layers 46 and 63, the first semiconductor plasma etching equipment may operate a first algorithm corresponding to a first etch end point to the second insulating layer 43 by detecting etch product materials that indicate the second insulating layer 43 in the chamber thereof. After the detection of materials that indicate the second insulating layer 43, the first semiconductor plasma etching equipment may maintain a second process environment to etch the second insulating layer 43.

The second process environment may be different than the first process environment. The first semiconductor plasma etching equipment may use the photoresist layer and the first insulating layer 38 as an etch mask and an etch stopping layer to etch the second insulating layer 43. The second insulating layer 43 may also be etched through second semiconductor plasma etching equipment. The second semiconductor plasma etching equipment may be different than the first semiconductor plasma etching equipment.

After the etching of the second insulating layer 43, the first semiconductor plasma etching equipment may operate a second algorithm corresponding a second etch end point to the first insulating layer 38 by detecting etch product materials that indicate the first insulating layer 38. After the detection of materials that indicate the first insulating layer 38, the first semiconductor plasma etching equipment may maintain a third process environment in the chamber thereof to partially etch the first insulating layer 38.

The third process environment may be the same as or different than the first process environment. The third process environment may be different than the second process environment. The first semiconductor plasma etching equipment may use the photoresist layer as an etch mask during the etch of first insulating layer 38. The first insulating layer 38 may also be etched through third semiconductor plasma etching equipment. The third semiconductor plasma etching equipment may be different than the first semiconductor plasma etching equipment.

As such, the first semiconductor plasma etching equipment may be operated to form a light-guiding structure 66 corresponding to the opening of the photoresist layer in the first, second, third and sixth insulating layers 38, 43, 46 and 63.

The light-guiding structure 66 may have a light path from an upper portion thereof to a lower portion thereof with respect to a selected ray of light. The light-guiding structure 66 may have a cavity shape defined by the first, second, third and sixth insulating layers 38, 43, 46 and 63.

The light-guiding structure 66 may have a trench shape defined by the first, second, third and sixth insulating layers 38, 43, 46 and 63. The light-guiding structure 66 may traverse the second, third and sixth insulating layers 43, 46 and 63 to extend to the first insulating layer 38 by a predetermined length L downwardly from an upper surface of the conductive pattern 16. The light-guiding structure 66 may have a sidewall which is tapered with respect to the main surface S of the semiconductor substrate 4 and disposed in the first, second, third and sixth insulating layers 38, 43, 46 and 63.

The light-guiding structure 66 may have a bottom surface parallel to the main surface S of the semiconductor substrate 4 and disposed in the first insulating layer 38. The light-guiding structure 66 may have a tapered shape from an upper portion of the semiconductor substrate 4 to a lower portion of the semiconductor substrate 4 along the light path. The bottom surface of the light-guiding structure 66 may face the first impurity diffused region 24 through the anti-reflective layer 34 and the first insulating layer 38.

The bottom surface of the light-guiding structure 66 may be formed to be disposed between a lower surface and the upper surface of the conductive pattern 16 of FIG. 2. The bottom surface of the light-guiding structure 66 may be formed to be disposed between the conductive pattern 16 and the second insulating layer 43. A length of the sidewall of the light-guiding structure 66 extending from the second insulating layer 43 to the first insulating layer 38 may be the same as or different than a thickness of the second insulating layer 43.

A thickness of the first insulating layer 38 under the bottom surface of the light-guiding structure 66 may be the same as or different than the thickness of the second insulating layer 43.

Referring back to FIG. 4, in the case when the first insulating layer 38 exposes the anti-reflective layer 34 as described in FIG. 2, the sixth insulating layer 63 may also be formed on the second insulating layer 43 to cover the at least one wire 58. The at least one wire 58 and the sixth insulating layer 63 may be repeatedly formed on the second insulating layer 43.

In this case, the first photo process may also be applied on the sixth insulating layer 63. A second plasma etching process may be performed on the first, second, third and sixth insulating layers 38, 43, 46 and 63. The second plasma etching process may be performed using the first semiconductor plasma etching equipment. The second plasma etching process may also be performed using the first and second etch end points of the first plasma etching process along a stacked order of the first, second, third and sixth insulating layers 38, 43, 46 and 63.

The second plasma etching process may also form the light-guiding structure 66, which may traverse the second and sixth insulating layers 43 and 63 to be disposed in the first insulating layer 38 and third insulating layer 46. On the other hand, when the first insulating layer 38 covers the anti-reflective layer 34, the sixth insulating layer 63 may also be formed on the third insulating layer 46 to cover the at least one wire 58. In this case, the first photo process may also be performed on the sixth insulating layer 63.

A third plasma etching process may also be performed on the first, second, third and sixth insulating layers 38, 43, 46 and 63. The third plasma etching process may be performed using the first semiconductor etching equipment. The third plasma etching process may also be performed using the first and second etch end points of the first plasma etching process by taking thickness of the first insulating layer 38 into consideration.

The third plasma etching process may also form the light-guiding structure 66, which may traverse the second, third and sixth insulating layers 43, 46 and 63 to be extended in the first insulating layer 38. Also, when the first insulating layer 38 covers the anti-reflective layer 34, the sixth insulating layer 63 may also be formed on the second insulating layer 43 to cover the at least one wire 58. In this case, the first photo process may also be performed on the sixth insulating layer 63.

A fourth plasma etching process may be performed on the first, second, third and sixth insulating layers 38, 43, 46 and 63. The fourth plasma etching process may be performed using the first semiconductor etching equipment. The fourth plasma etching process may also be performed using the first and second etch end points by taking the thickness of the first insulating layer 38 into consideration.

The fourth plasma etching process may also form the light-guiding structure, which may traverse the second and sixth insulating layers 43 and 63 to be disposed in the first and third insulating layers 38 and 46. The light-guiding structure 66 does not cause damage of a plasma etching process to the first impurity diffused region 24 because the bottom surface thereof is stably disposed in the first insulating layer 38. Subsequently, after the formation of the light-guiding structure 66, the photoresist layer may be removed from the sixth insulating layer 63.

A filling structure 74 may be filled in the light-guiding structure 66. The filling structure 74 may include a material having a refractive index larger than that of silicon oxide. The filling structure 74 may be included in an image sensor 80 according to some example embodiments together with the conductive pattern 16, the first impurity diffused region 24, and the light-guiding structure 66.

Although a design rule of the image sensor 80 is gradually reduced, the light-guiding structure 66 may receive a large amount of the selected ray from the light per unit time as compared with the related art due to the tapered shape thereof. Also, the second insulating layer 43 may be formed between the conductive pattern 16 and the at least one wire 58 by taking an optical property of the image sensor 80 into consideration. As such, the image sensor 80 may have improved electrical and optical properties as compared with the related art by including the light-guiding structure 66.

Example Embodiment 2

Figure 5:
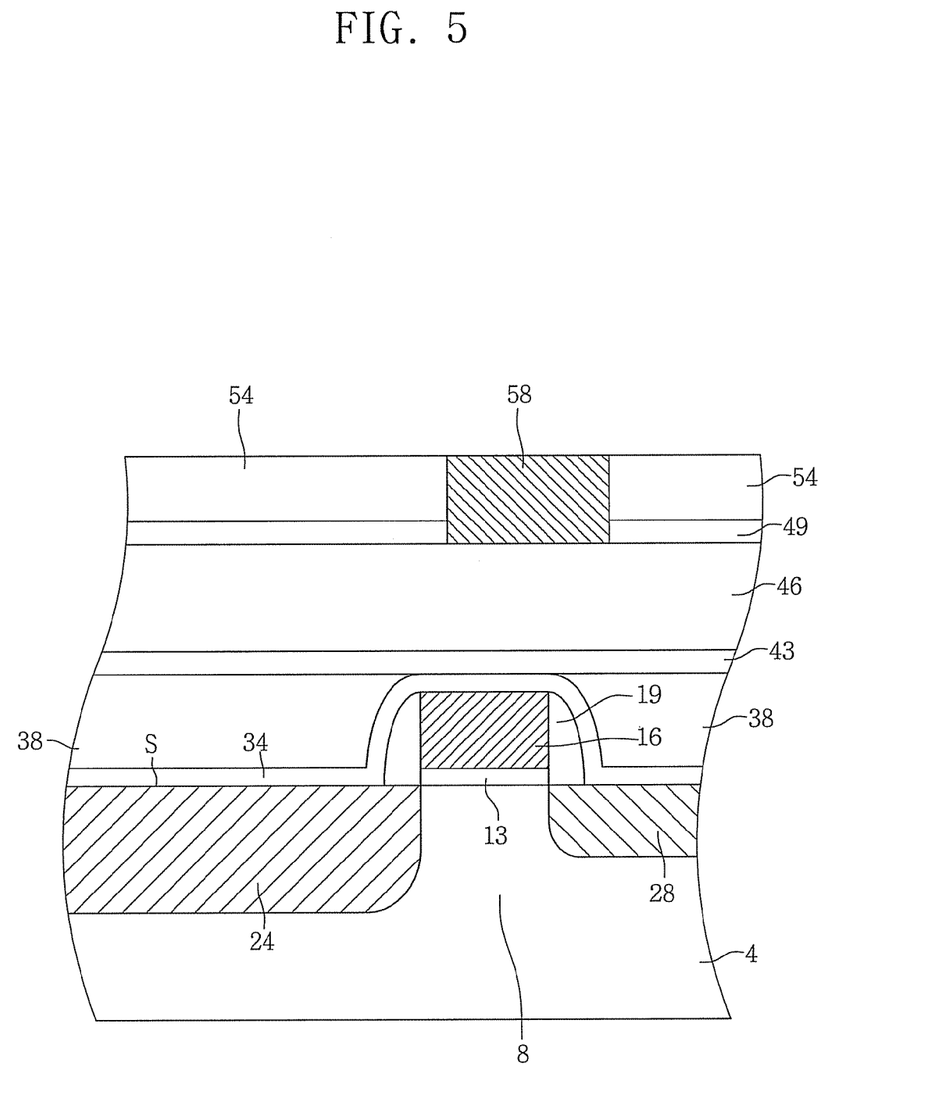
FIGS. 5 through 6 are cross-sectional views taken along line V-V' and VI-VI' of FIG. 1, illustrating a method of forming an image sensor.

FIGS. 5 through 6 are cross-sectional views taken along line V-V' and VI-VI' of FIG. 1, illustrating a method of forming an image sensor 80' according to an example embodiment. FIGS. 5 through 6 use similar reference numerals for similar members as shown in FIGS. 2 through 4.

Referring to FIG. 5, a fourth insulating layer 49 may be formed on the third insulating layer 46 of FIG. 3. The fourth insulating layer 49 may include a material having a different etching rate than the third insulating layer 46. The fourth insulating layer 49 may include a material having the same etching rate as the second insulating layer 43 of FIG. 3. A fifth insulating layer 54 may be formed on the fourth insulating layer 49.

The fifth insulating layer 54 may have a different etching rate than the fourth insulating layer 49. The fifth insulating layer 54 may have the same etching rate as the third insulating layer 46. The at least one wire 58 of FIG. 3 may be formed in the fourth and fifth insulating layers 49 and 54. The at least one wire 58 may penetrate the fourth and fifth insulating layers 49 and 54 to be in contact with the third insulating layer 46.

Referring to FIG. 6, the sixth insulating layer 63 of FIG. 4 may be formed on the fifth insulating layer 54 to cover the at least one wire 58. The fourth insulating layer 49, the fifth insulating layer 54, the at least one wire 58 and the sixth insulating layer 63' may be formed at least one time on the third insulating layer 46. A second photo process may be performed on the sixth insulating layer 63. The second photo process may be the same as the first photo process of FIG. 4.

A fifth plasma etching process may be performed on the first through sixth insulating layers 38, 43, 46, 49, 54 and 63. The fifth plasma etching process may be performed using the first semiconductor etching equipment of FIG. 4. The first semiconductor etching equipment may etch the fifth and sixth insulating layers 54 and 63 by maintaining a fourth process environment in the chamber thereof. The fourth process environment may be the same as at least one of the first through third process environments. The fourth process environment may be different than the first through third process environments.

The first semiconductor plasma etching equipment may etch the fifth and sixth insulating layers 54 and 63 using the photoresist layer of FIG. 4, and the fourth insulating layer 49 as an etch mask and an etch stopping layer. After the etching of the fifth and sixth insulating layers 54 and 63, the first semiconductor plasma etching equipment may operate a third algorithm corresponding to a third etch end point to the fourth insulating layer 49 by detecting etch product materials that indicate the fourth insulating layer 49 in the chamber thereof.

After the detection of materials of the fourth insulating layer 49, the first semiconductor plasma etching equipment may maintain a fifth process environment to etch the fourth insulating layer 49. The fifth process environment may be the same as or different than the second process environment of FIG. 4. The first semiconductor plasma etching equipment may etch the fourth insulating layer 49 using the photoresist layer and the third insulating layer 46 as an etch mask and an etch stopping layer.

After the etching of the fourth insulating layer 49, the first semiconductor plasma etching equipment may operate a fourth algorithm corresponding to a fourth etch end point to the third insulating layer 46 by detecting etch product materials that indicate the third insulating layer 46 in the chamber thereof. After the detection of the materials of the third insulating layer 46, the first semiconductor plasma etching equipment may sequentially maintain the first through third process environments of FIG. 4 to etch the first through third insulating layers 38, 43 and 46.

The first insulating layer 38 may expose or may not expose the anti-reflective layer 34 of FIG. 3. Accordingly, the first semiconductor plasma etching equipment may operate the first and second algorithms of the first, second, third or fourth plasma etching process of FIG. 4 with respect to the first to third insulating layers 38, 43 and 46. As such, the first semiconductor plasma etching equipment may form a light-guiding structure 69 in the first through sixth insulating layers 38, 43, 46, 49, 54 and 63.

The light-guiding structure 69 may have a cavity shape defined by the first through sixth insulating layers 38, 43, 46, 49, 54 and 63. The light-guiding structure 69 may have a trench shape defined by the first through sixth insulating layers 38, 43, 46, 49, 54 and 63. The light-guiding structure 69 may penetrate the second through sixth insulating layers 43, 46, 49, 54 and 63 to extend to the first insulating layer 38 by a predetermined length L downwardly from an upper surface of the conductive pattern 16.

The light-guiding structure 69 may have an tapered sidewall with respect to the main surface S of the semiconductor substrate 4 disposed in the first through sixth insulating layers 38, 43, 46, 49, 53 and 63. The light-guiding structure 69 may have a bottom surface parallel to the main surface S of the semiconductor substrate 4 and disposed in the first insulating layer 38. The light-guiding structure 69 may have a tapered shape from an upper portion to a lower portion of the semiconductor substrate 4 along the light path.

The bottom surface of the light-guiding structure 69 may face the first impurity diffused region 24 through the anti-reflective layer 34 and the first insulating layer 38. The bottom surface of the light-guiding structure 69 may be formed to be disposed between the upper surface and a lower surface of the conductive pattern 16 of FIG. 2. The bottom surface of the light-guiding structure 69 may be formed to be disposed between the conductive pattern 16 and the second insulating layer 43.

A length of the sidewall extending from the second insulating layer 43 to the first insulating layer 38 may be the same as or different than a thickness of the second insulating layer 43. A thickness of the first insulating layer 38 under the bottom surface of the light-guiding structure 69 may be the same as or different than the thickness of the second insulating layer 43.

The light-guiding structure 69 does not cause damage of the plasma etching process to the first impurity diffused region 24 because the bottom surface thereof is stably disposed in the first insulating layer 38. Subsequently, after the formation of the light-guiding structure 69, the photoresist layer may be removed from the sixth insulating layer 63. The filling structure 74 may be filled in the light-guiding structure 69. The filling structure 74 may include a material having a refractive index larger than silicon oxide.

The filling structure 74 may be included in an image sensor 80' according to some example embodiments together with the conductive pattern 16, the first impurity diffused region 24 and the light-guiding structure 69. Although a design rule of the image sensor 80' is gradually reduced, the light-guiding structure 69 may receive a large amount of a selected ray from the light per unit time as compared with the related art due to the tapered shape thereof.

Also, the second insulating layer 43 may be formed between the conductive pattern 16 and the at least one wire 58, or between the conductive pattern 16 and the fourth insulating layer 49 by taking an optical property of the image sensor 80' into consideration. As such, the image sensor 80' may have electrical and optical properties improved as compared with the related art by including the light-guiding structure 69.

Next, a processor-based system according to an example embodiment will be described with reference to FIG. 7.

Figure 7:
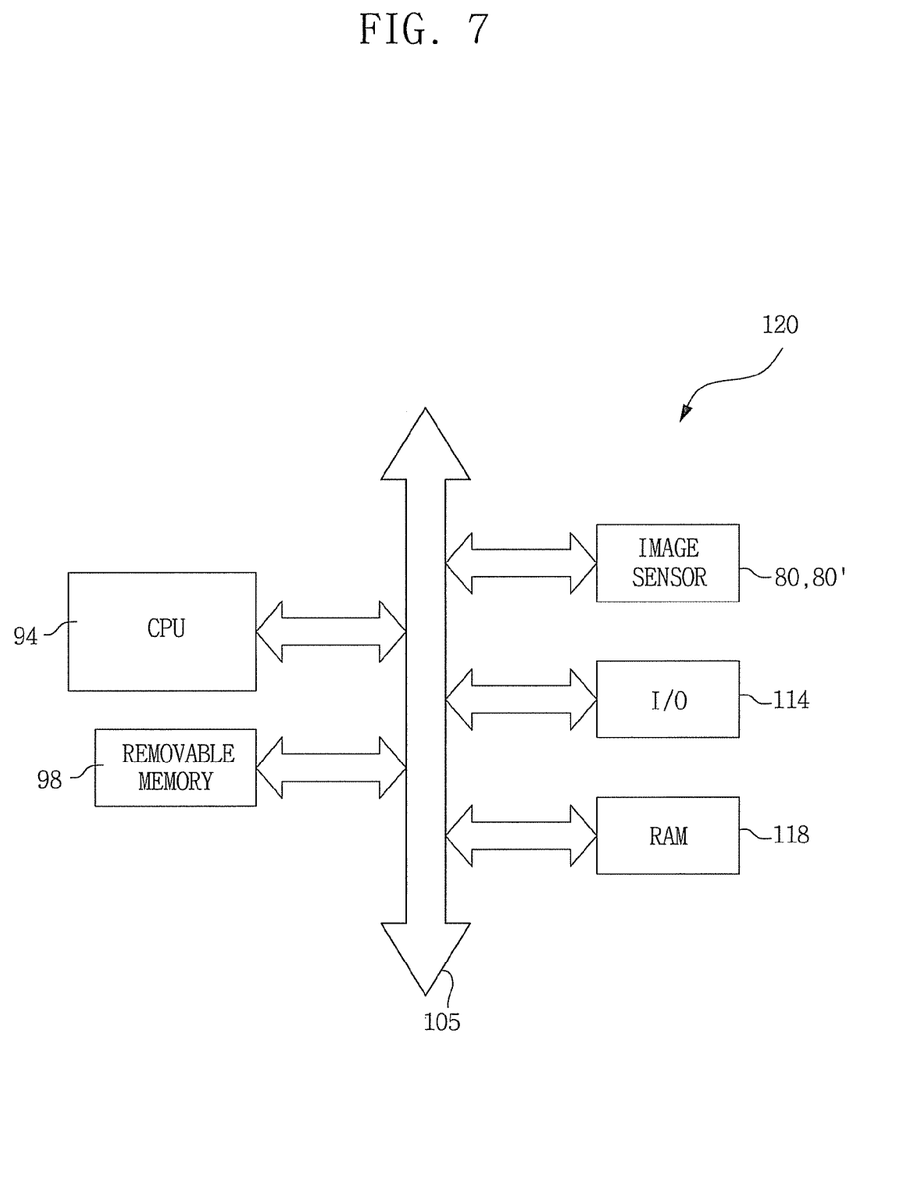
FIG. 7 is a plan view showing a processor-based system including the image sensor of FIG. 1.

FIG. 7 is a plan view showing a processor-based system including the image sensor 80 or 80' of FIG. 1.

Referring to FIG. 7, a processor-based system 120 may be a camera system. In this case, the processor-based system 120 may include a central processing unit (CPU) 94 and a removal memory 98, which may be electrically connected to each other through a bus line 105. The CPU 94 may include a microprocessor. The removal memory 98 may include a flash memory, but it would be apparent to one having ordinary skill in the art that alternative types of memory could be used instead of flash memory as the removal memory 98.

The processor-based system 120 may further include an image sensor 80 or 80', an input/output device (I/O device) 114 and a random access memory (RAM) 118. The image sensor 80 or 80', the I/O device 114 and the RAM 118 may be connected to the CPU 94 and the removal memory 98 through the bus line 105. The image sensor 80 or 80' may include the light-guiding structure 66 or 69 of FIG. 4 or FIG. 6. The image sensor 80 or 80' may improve a quality of a digital image of the processor-based system 120 as compared with the related art.

Meanwhile, the processor-based system 120 may also include a computer system, a scanner, a vehicle navigator, a video phone or a data compression system.

As described above, some example embodiments may relate to a light-guiding structure having a bottom surface stably spaced from a semiconductor substrate. To this end, some example embodiments may relate to insulating layers having different etching rates than each other on the semiconductor substrate. The insulating layers may correspond to an etch stopping layer with respect to each other during formation of the light-guiding structure. The etch stopping layer may control an etching extent with respect to the insulating layers in a plasma etching process.

Accordingly, the plasma etching process may stably space the light-guiding structure from the semiconductor substrate. In addition, because the light-guiding structure is on the anti-reflective layer, the plasma etching process may minimize damage to the semiconductor substrate as compared with the related art. The light-guiding structure may be dispose in an image sensor to improve electrical and optical properties of the image sensor as compared with the related art.

The image sensor may be disposed in a processor-based system. The image sensor may improve a quality of digital image of the processor-based system as compared with the related art.

The foregoing is merely illustrative of some example embodiments and is not to be construed as limiting thereof. Although some example embodiments have been described, those skilled in the art will readily appreciate that many modifications are possible without materially departing from the novel teachings and advantages of some example embodiments. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is merely illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A light-guiding structure comprising:
a bottom surface and a sidewall defined by a first, a second, and a third insulating layer sequentially stacked on a semiconductor substrate,
wherein the bottom surface is parallel to a main surface of the semiconductor substrate and disposed in the first insulating layer,
wherein the sidewall penetrates the second and third insulating layers to extend to the first insulating layer and is tapered, and
wherein the first insulating layer defines an opening that exposes a partial area of a lower surface of the second insulating layer that extends across the opening of the first insulating layer and is adjacent to the sidewall.

2. The structure of claim 1, wherein the second insulating layer is thinner than the first and third insulating layers.

3. The structure of claim 2, wherein
an etching rate of the second insulating layer is different than an etching rate of the first and third insulating layers in an equivalent processing environment,
the second insulating layer includes a second material that is configured to form a second etch product in the equivalent processing environment,
the first insulating layer includes a first material that is configured to form a first etch product in the equivalent processing environment, and
the second etch product is configured to be distinguishable from the first etch product when using endpoint detection to detect etch product materials of the first and second insulating layers, respectively.

4. The structure of claim 3, wherein a length of the sidewall extending from the second insulating layer to the first insulating layer is the same as a thickness of the second insulating layer.

5. The structure of claim 4, wherein a thickness of the first insulating layer under the bottom surface is the same as the thickness of the second insulating layer.

6. The structure of claim 1, futher comprising:
a conductive pattern on the semiconductor substrate, wherein
the first insulating layer surrounds the conductive pattern,
the semiconductor substrate includes a diffused region below the bottom surface of the light-guiding structure, and
a vertical distance between an upper surface of the conductive pattern and an upper surface of the semiconductor substrate is greater than a vertical distance between the bottom surface of the light-guiding structure and an upper surface of the diffused region.

7. An image sensor comprising:
a conductive pattern disposed on a semiconductor substrate;
first, second, and third insulating layers disposed sequentially on the semiconductor substrate and the conductive pattern; and
a light-guiding structure disposed adjacent to the conductive pattern and configured to vertically penetrate the second and third insulating layers to extend to the first insulating layer,
wherein the light-guiding structure includes a bottom surface parallel to a main surface of the semiconductor substrate and disposed in the first insulating layer and a sidewall disposed in the first through third insulating layers and tapered, and
the first insulating layer is not vertically between a lower surface of the second insulating layer and an upper surface of the conductive pattern underneath.

8. The sensor of claim 7, wherein the bottom surface of the light-guiding structure is disposed between a lower surface and an upper surface of the conductive pattern.

9. The sensor of claim 7, wherein the bottom surface of the light-guiding structure is disposed between the conductive pattern and the second insulating layer.

10. The sensor of claim 7, wherein
an etching rate of the second insulating layer is different than an etching rate of the first and third insulating layers in an equivalent processing environment, the second insulating layer includes a second material that is configured to form a second etch product in the equivalent processing environment, the first insulating layer includes a first material that is configured to form a first etch product in the equivalent processing environment, and the second etch product is configured to be distinguishable from the first etch product when using endpoint detection to detect etch product materials of the first and second insulating layers, respectively.

11. The sensor of claim 7, further comprising:

a photodiode disposed in the semiconductor substrate;

an anti-reflective layer disposed between the semiconductor substrate and the first insulating layer, and configured to conformally cover the conductive pattern; and at least one wire disposed in the third insulating layer.

12. The sensor of claim 11, wherein an occupied area of the photodiode in the semiconductor substrate is the same as an area of the bottom surface of the light-guiding structure.

13. The sensor of claim 12, wherein the photodiode faces the bottom surface of the light-guiding structure across the anti-reflective layer and the first insulating layer, and the second insulating layer is disposed between the conductive pattern and the at least one wire.

14. The sensor of claim 13, wherein the first insulating layer surrounds the conductive pattern and partially exposes the anti-reflective layer on an upper portion of the conductive pattern, and the second insulating layer is disposed on the anti-reflective layer and the first insulating layer to be in contact with the third insulating layer.

15. The sensor of claim 13, wherein the first insulating layer covers the anti-reflective layer, and the second insulating layer is disposed on the first insulating layer to be in contact with the third insulating layer.

16. The sensor of claim 13, further comprising a fourth insulating layer disposed on the third insulating layer, wherein an etching rate of the fourth insulating layer is the same as an etching rate of the second insulating layer, and the fourth insulating layer is penetrated by the at least one wire.

17. An image sensor comprising:

a substrate;

a conductive pattern on the substrate;

an anti-reflective layer on the substrate and on the conductive pattern;

a first insulating layer on the anti-reflective layer;

a light-guiding structure that extends into, but not through, the first insulating layer;

a second insulating layer on the conductive pattern; and at least one wire on the second insulating layer, wherein the anti-reflective layer is in contact with the second insulating layer through an opening defined by the first insulating layer above an upper surface of the conductive pattern.

18. The image sensor of claim 17, further comprising:

a third insulating layer disposed between the at least one wire and the second insulating layer, wherein the anti-reflective layer is vertically between an upper surface of the conductive pattern and a lower surface of the second insulating layer.

19. The image sensor of claim 17, wherein the light-guiding structure has a tapered sidewall.

20. The image sensor of claim 17, wherein the first insulating layer surrounds the conductive pattern and partially exposes a part of the anti-reflective layer on an upper portion of the conductive pattern, the second insulating layer is on the first insulating layer and vertically over the part of the anti-reflective layer exposed by the first insulating layer.

* * * * *